United States Patent
Jingu

(10) Patent No.: US 10,818,471 B2
(45) Date of Patent: Oct. 27, 2020

(54) CHARGED PARTICLE BEAM DEVICE

(71) Applicant: Hitachi High-Tech Corporation, Minato-ku, Tokyo (JP)

(72) Inventor: Takahiro Jingu, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 269 days.

(21) Appl. No.: 16/061,469

(22) PCT Filed: Dec. 22, 2015

(86) PCT No.: PCT/JP2015/085745
§ 371 (c)(1),
(2) Date: Jun. 12, 2018

(87) PCT Pub. No.: WO2017/109843
PCT Pub. Date: Jun. 29, 2017

(65) Prior Publication Data
US 2020/0266027 A1 Aug. 20, 2020

(51) Int. Cl.
*H01J 37/244* (2006.01)
*H01J 37/28* (2006.01)

(52) U.S. Cl.
CPC ............ *H01J 37/244* (2013.01); *H01J 37/28* (2013.01); *H01J 2237/24455* (2013.01); *H01J 2237/2802* (2013.01)

(58) Field of Classification Search
CPC ..................... H01J 37/244; H01J 37/28; H01J 2237/24455; H01J 2237/2802
USPC .......................... 250/306, 307, 309, 310, 311
See application file for complete search history.

(56) References Cited

U.S. PATENT DOCUMENTS

| 9,588,054 B2* | 3/2017 | Urano ................. G01N 21/8851 |
| 2008/0224037 A1 | 9/2008 | Fujisawa et al. |
| 2012/0205539 A1 | 8/2012 | Hlavenka et al. |
| 2012/0273677 A1* | 11/2012 | Tuma ...................... H01J 37/26 250/307 |
| 2013/0032713 A1 | 2/2013 | Barbi et al. |

(Continued)

FOREIGN PATENT DOCUMENTS

| CN | 102637571 A | 8/2012 |
| CN | 104956461 A | 9/2015 |

(Continued)

OTHER PUBLICATIONS

Chinese-language Office Action issued in counterpart Chinese Application No. 201580084928.5 dated Mar. 25, 2019 with English translation (10 pages).

(Continued)

*Primary Examiner* — Nicole M Ippolito
(74) *Attorney, Agent, or Firm* — Crowell & Moring LLP

(57) ABSTRACT

A charged particle beam apparatus includes an irradiation system that supplies a converged charged particle beam to a sample and scans the sample with the charged particle beam, an imaging optical system that images the energy generated in the sample, a detection system that detects an image formed by the imaging optical system with an avalanche photodiode array, and a control unit that changes a pixel to be operated in a Geiger mode among pixels configuring the avalanche photodiode array according to movement of an irradiation range of the energy.

10 Claims, 9 Drawing Sheets

(56) References Cited

U.S. PATENT DOCUMENTS

2013/0056634 A1* 3/2013 Sluijterman ............ H01J 37/28
250/307
2015/0364296 A1 12/2015 Nomaguchi et al.

FOREIGN PATENT DOCUMENTS

| JP | 8-285947 A | 11/1996 |
| JP | 2008-226616 A | 9/2008 |

OTHER PUBLICATIONS

International Search Report (PCT/ISA/210) issued in PCT Application No. PCT/JP2015/085745 dated Mar. 1, 2016 with English translation (two (2) pages).
Japanese-langauge Written Opinion (PCT/ISA/237) issued in PCT Application No. PCT/JP2015/085745 dated Mar. 1, 2016 (three (3) pages).

* cited by examiner

[Fig. 1]
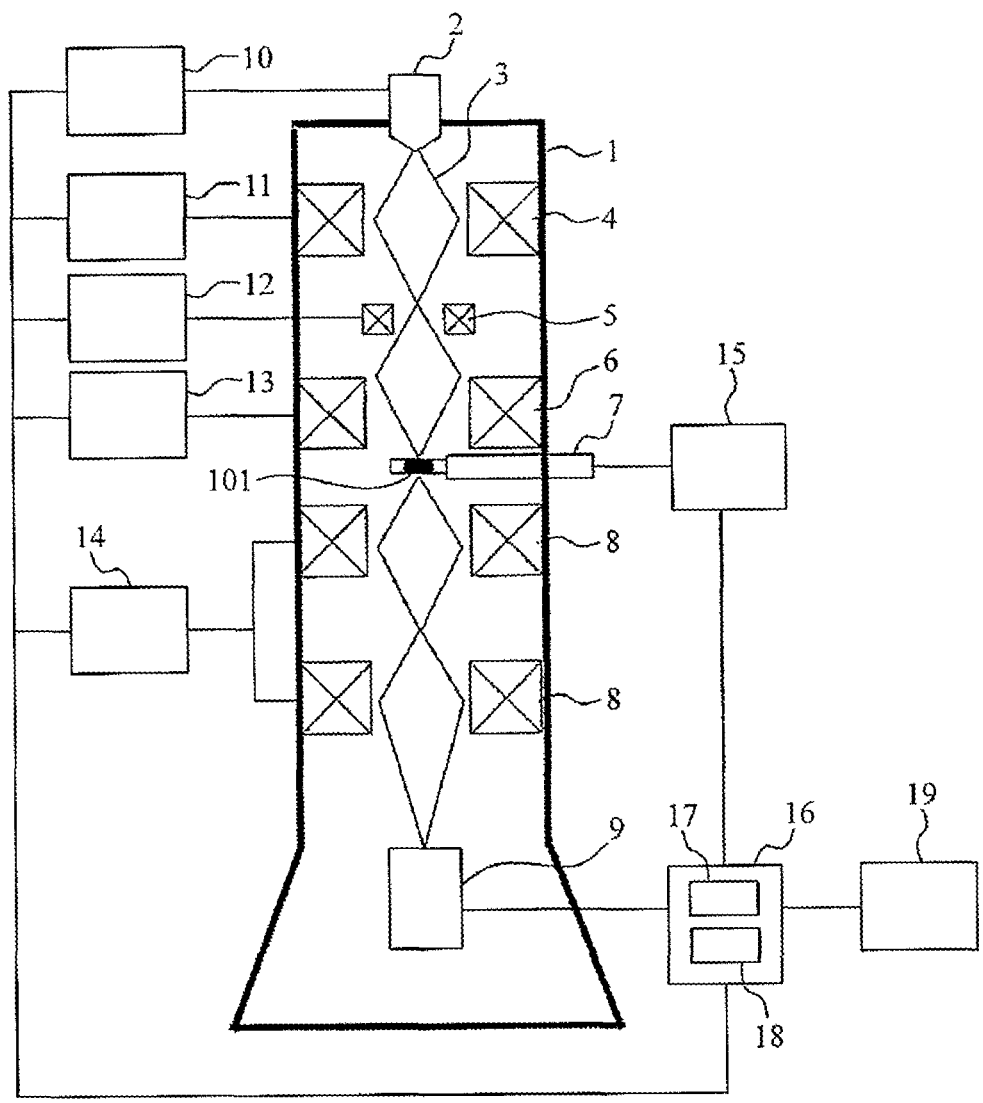

[Fig. 2]
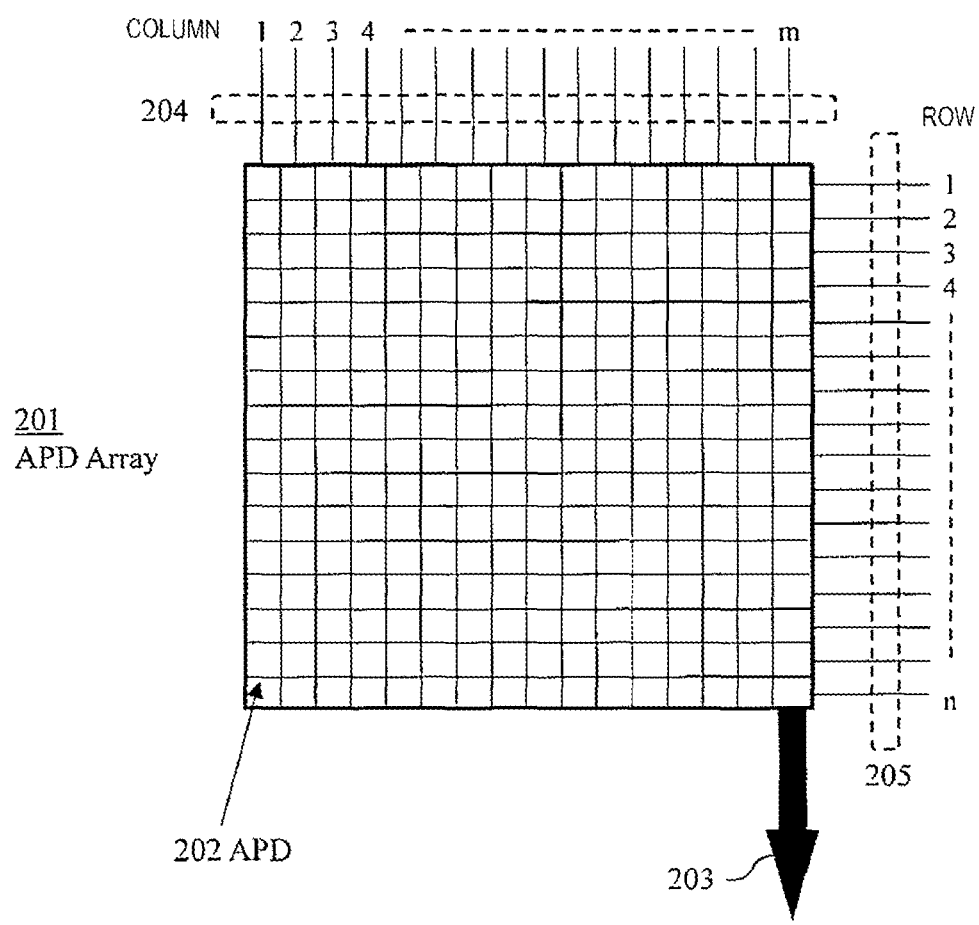

[Fig. 3]
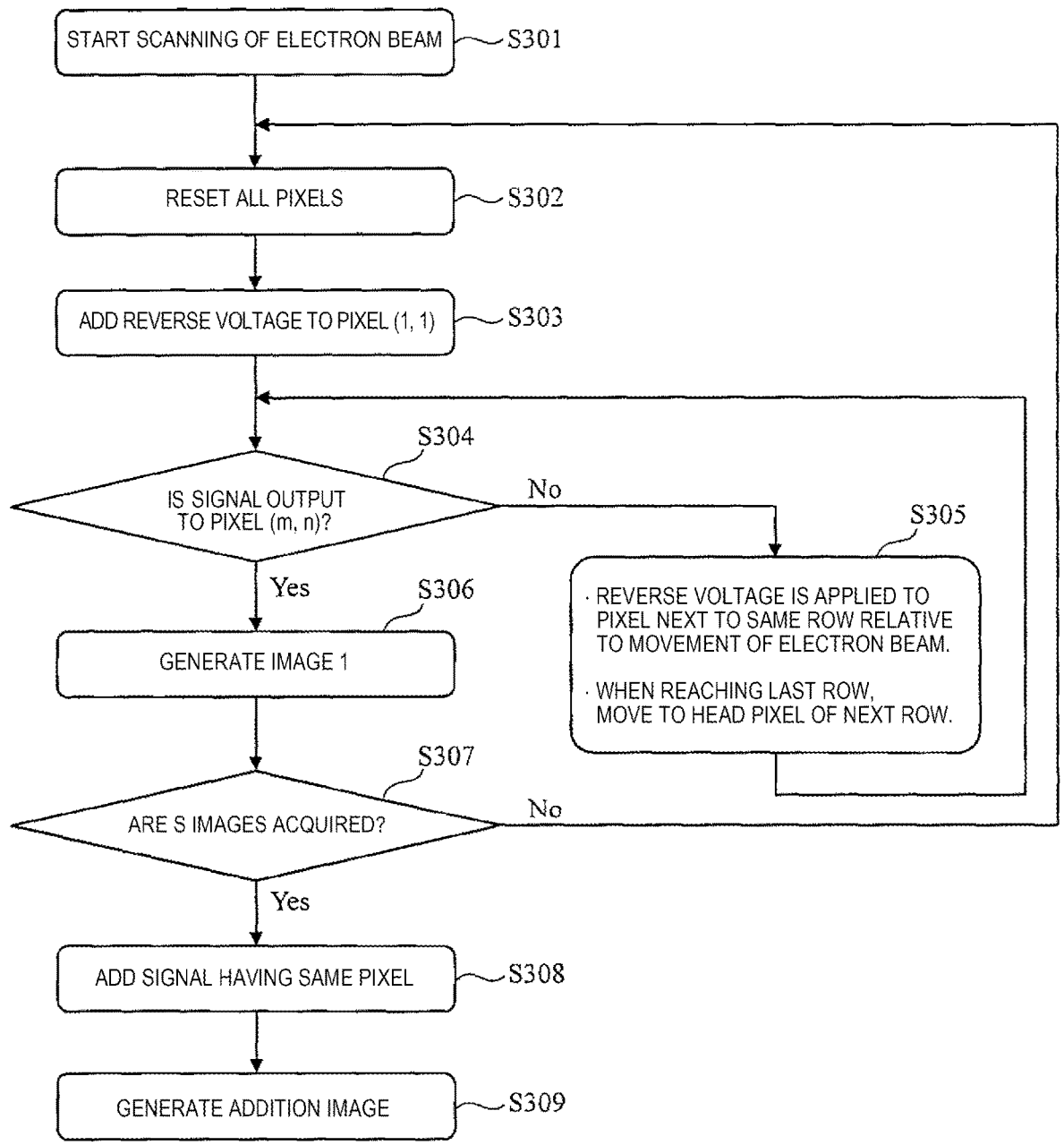

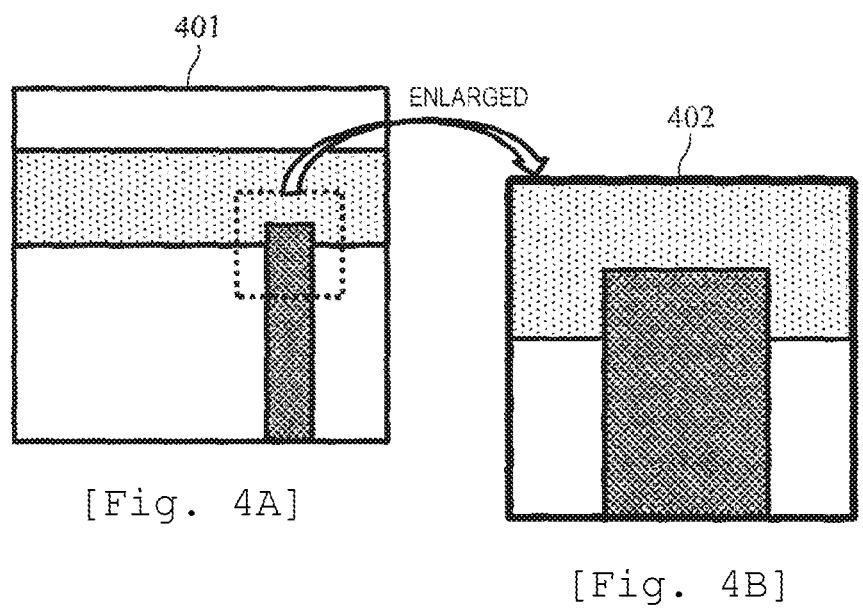
[Fig. 4A]
[Fig. 4B]

[Fig. 5]
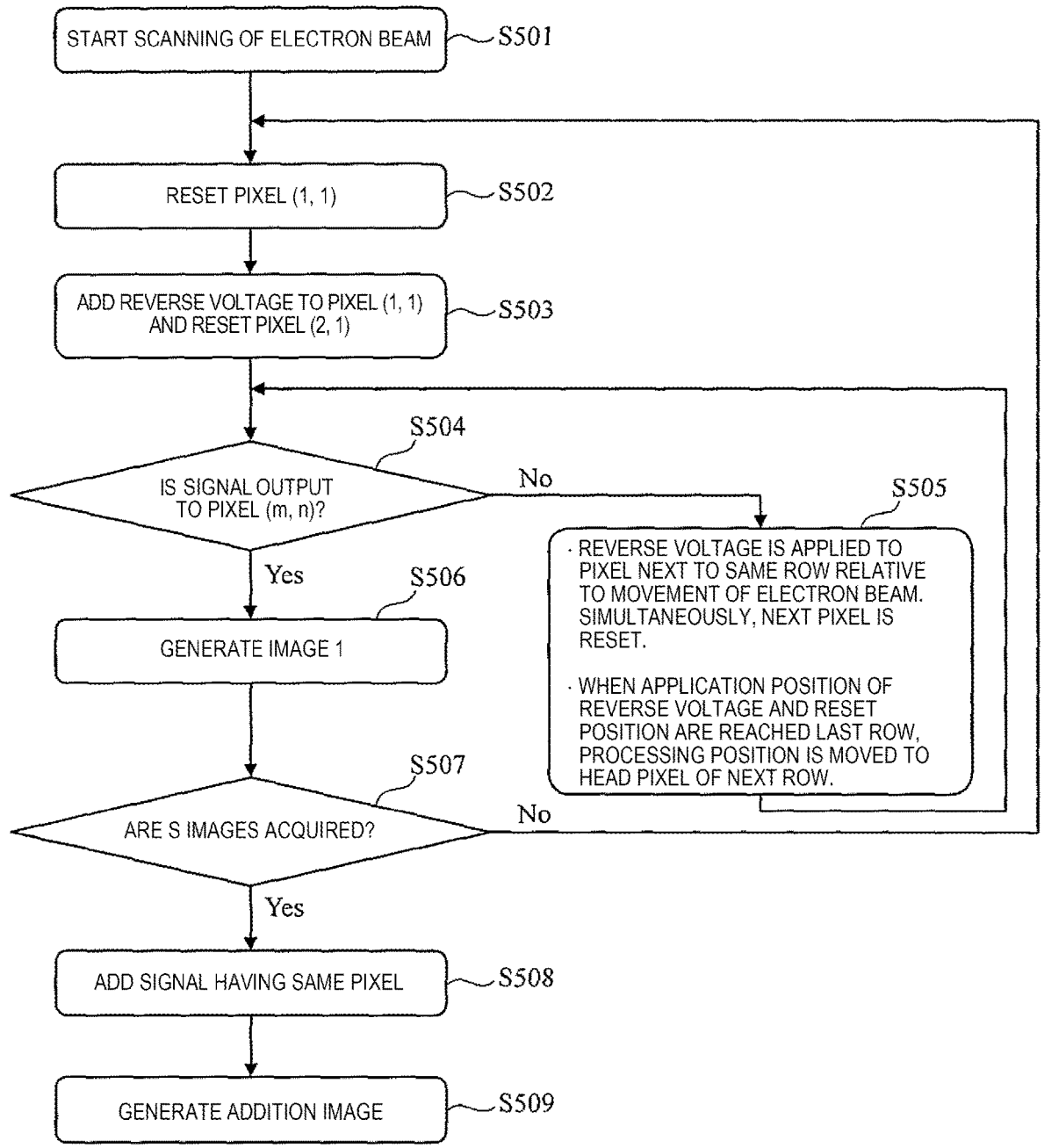

[Fig. 6]
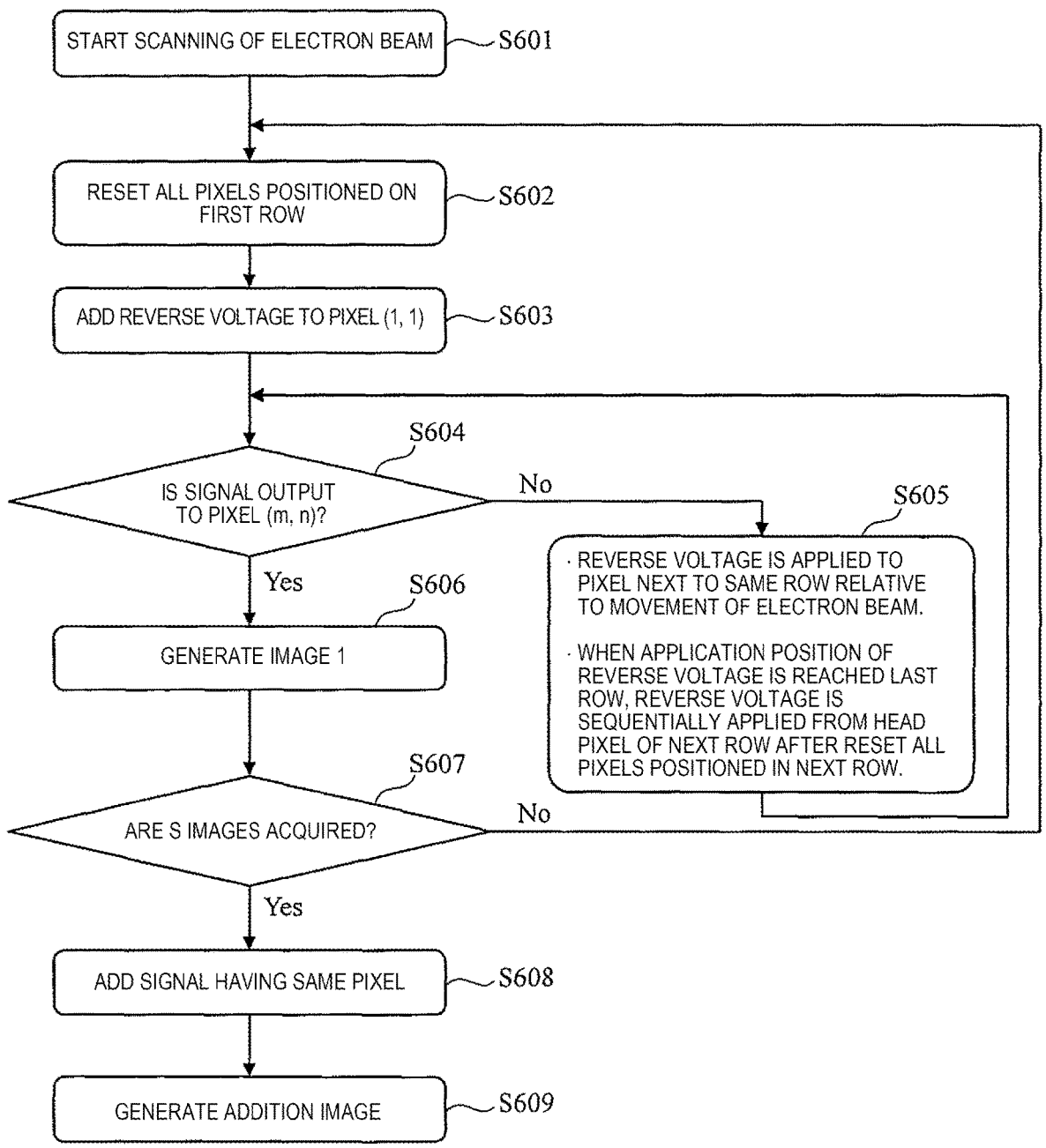

[Fig. 7]
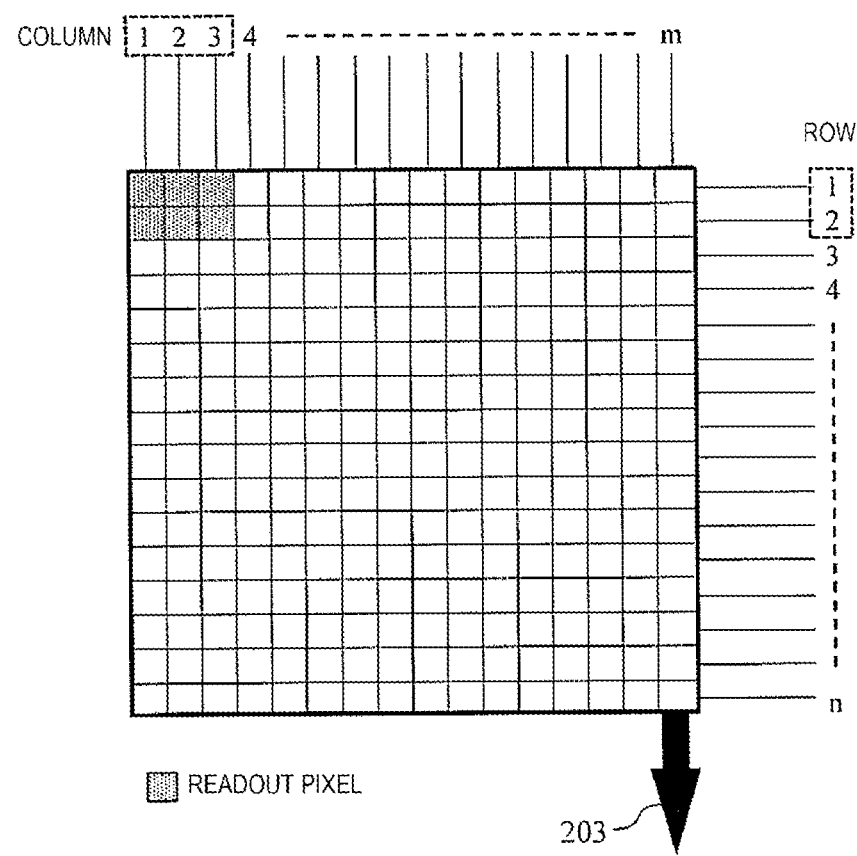

[Fig. 8]
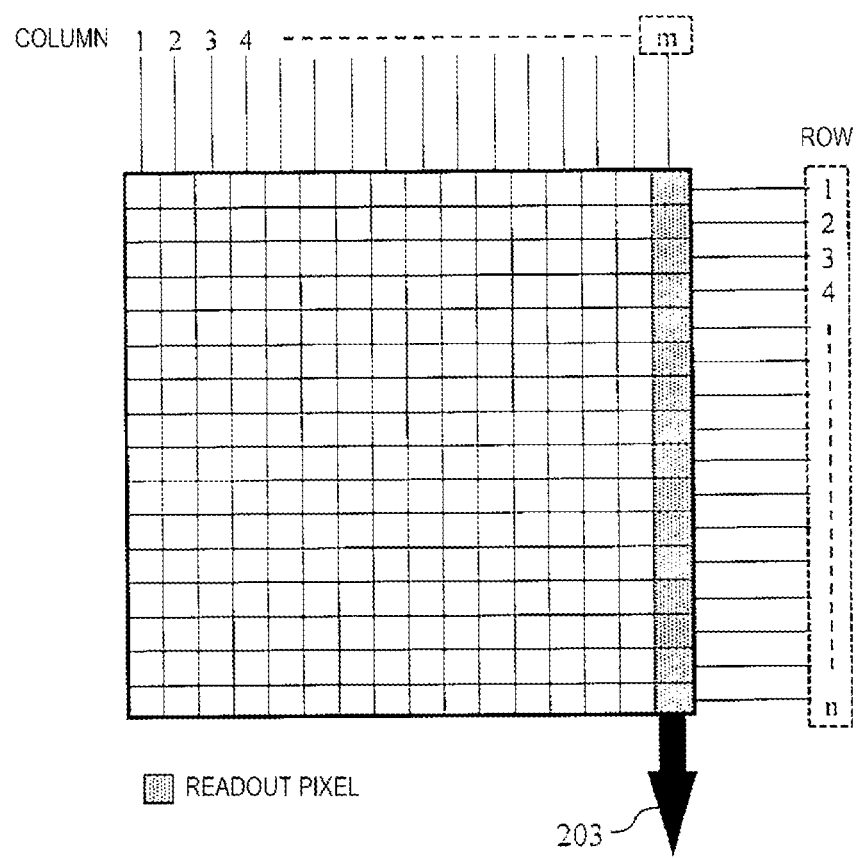

[Fig. 9]
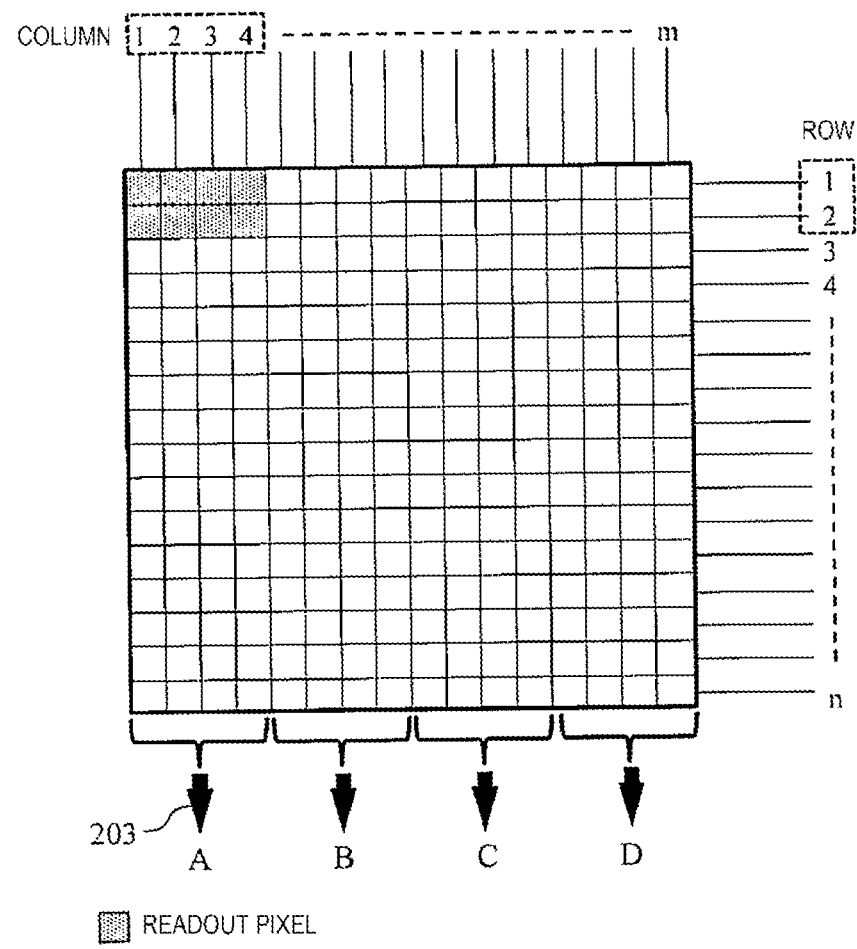

CHARGED PARTICLE BEAM DEVICE

TECHNICAL FIELD

The present invention relates to a charged particle beam apparatus.

BACKGROUND ART

A charged particle beam apparatus is an example of an apparatus that detects energy generated in a sample. The charged particle beam apparatus supplies a charged particle beam (for example, an electron beam) to the sample and detects the energy generated as a result. The energy to be detected is at least one of transmitted electrons, secondary electrons, and reflected electrons, for example. This type of technology is described in PTL 1, for example.

CITATION LIST

Patent Literature

PTL 1: JP-A-2008-226616

SUMMARY OF INVENTION

Technical Problem

In the apparatus described in PTL 1, the energy generated in the sample is converted into light using a fluorescent material (for example, a scintillator), and the light is detected by an imaging medium (for example, a camera). However, since the scintillator is a fluorescent substance, the scintillator keeps lighting for a certain period of time even after light emission. That is, there is room for improvement in responsiveness. In addition, since the fluorescent substance is deteriorated by energy generated in the sample, conversion efficiency to light is lowered, and it is necessary to measure and correct a state of deterioration at any time.

Solution to Problem

In order to solve the above problem, the present invention employs, for example, the configuration described in the claims. The present specification includes a plurality of means for solving the problems, for example, a "charged particle beam apparatus including an irradiation system that supplies a converged charged particle beam to a sample and scans the sample with the charged particle beam, an imaging optical system that images the energy generated in the sample, a detection system that detects an image formed by the imaging optical system with an avalanche photodiode array, and a control unit that changes a pixel to be operated in a Geiger mode among pixels configuring the avalanche photodiode array according to movement of an irradiation range of the energy".

Advantageous Effects of Invention

According to the invention, it is possible to provide the charged particle beam apparatus which is excellent in responsiveness as compared with the related art and does not require correction of image change due to deterioration of the fluorescent substance. The problems, configurations, and effects other than those described above will be clarified by the following description of the embodiments.

BRIEF DESCRIPTION OF DRAWINGS

FIG. 1 is diagram illustrating an overall structure of an energy detection apparatus according to Example 1.

FIG. 2 is a diagram illustrating a configuration of an avalanche photodiode array.

FIG. 3 is a flowchart illustrating a generation operation of an STEM image in Example 1.

FIGS. 4A and 4B are diagrams illustrating a reacquisition operation of an attention region using the STEM image.

FIG. 5 is a flowchart illustrating a generation operation of an STEM image in Example 2.

FIG. 6 is a flowchart illustrating a generation operation of an STEM image in Example 3.

FIG. 7 is a diagram illustrating a change example of a readout pixel size in Example 4.

FIG. 8 is a diagram illustrating a change example of the readout pixel size in Example 4.

FIG. 9 is a diagram illustrating a change example of the readout pixel size in Example 4.

DESCRIPTION OF EMBODIMENTS

Hereinafter, embodiments of the present invention will be described based on drawings. The embodiments of the present invention are not limited to the examples described later, and various modifications are possible within the scope of the technical idea thereof.

(1) Example 1

(1-1) Configuration of Scanning Transmission Electron Microscope

FIG. 1 illustrates an overall configuration of a scanning transmission electron microscope (hereinafter, referred to as "STEM") which is an example of an energy detection device. A scanning transmission electron microscope 100 includes an electron gun 2, an irradiation lens 4, a scanning coil 5, an objective lens 6, a sample stage 7, a magnifying lens system 8, and an imaging device 9, which are provided in a microscope main body 1. The imaging device 9 includes at least an avalanche photodiode array to be described. Here, the irradiation lens 4, the scanning coil 5, and the objective lens 6 configure an irradiation system, and the magnifying lens system 8 configures an imaging optical system. In addition, the imaging device 9 configures a detection system.

The scanning transmission electron microscope 100 further includes an electron gun control device 10 that controls the electron gun 2, an irradiation lens control device 11 that controls the irradiation lens 4, a scanning coil control device 12 that controls the scanning coil 5, an objective lens control device 13 that controls the objective lens 6, a magnifying lens control device 14 that controls the magnifying lens system 8, a sample stage control device 15 that controls the sample stage 7, a computer 16, and a monitor 19. The computer 16 includes a control device 17 and an image processing control device 18. The control device 17 controls the electron gun control device 10, the irradiation lens control device 11, the scanning coil control device 12, the objective lens control device 13, the magnifying lens control device 14, and the sample stage control device 15. In addition, the control device 17 controls an operation of the imaging device 9 (avalanche photodiode array).

The electron beam 3 emitted from the electron gun 2 is converged by the irradiation lens 4 and deflected by the scanning coil 5 configured by deflection coils in an x direction and a y direction. The electron beam 3 deflected in two directions is focused on the sample 101 held by the sample stage 7 by the objective lens 6 and scans the sample surface. The image of the electron beam 3 transmitted through the sample 101 is enlarged by the magnifying lens system 8 and then formed on the imaging surface of the imaging device 9. The imaging device 9 images the image. In the present specification, imaging by the imaging device 9 is also referred to as "detection". The scanning transmission image (STEM image) imaged by the imaging device 9 is sent to the computer 16. The image processing control device 18 displays the scanning transmission image output from the imaging device 9 on the monitor 19.

The electron gun control device 10, the irradiation lens control device 11, the scanning coil control device 12, the objective lens control device 13, the magnifying lens control device 14, the sample stage control device 15, and the computer 16 can be configured as modules. The control devices include an input and output interface that transmits and receives signals, a memory that saves a control algorithm, and a processor that executes an algorithm.

(1-2) Configuration of Avalanche Photodiode Array

FIG. 2 illustrates the configuration of an avalanche photodiode array 201 (hereinafter, referred to as "APDA 201"). The APDA 201 is an array element in which a plurality of avalanche photodiodes 202 (hereinafter, referred to as "APDs 202") are arranged in a matrix form. The APDA 201 illustrated in FIG. 2 has a configuration in which the APD 202 is arranged in m columns×n rows. Each APD 202 corresponds to a pixel of the APDA 201. In the present embodiment, pixels at the position of i columns×j rows are represented by pixels (i, j). Therefore, the pixel (1, 1) means the pixel at the position of 1 column×1 row.

The APD 202 is a type of photodiode (hereinafter, referred to as "PD") and is a high-speed and high-sensitivity PD in which photocurrent is multiplied by application of a reverse voltage. The APD 202 is a device that measures the energy amount by counting energy (for example, the number of photons configuring the light). When the reverse voltage to be applied to the APD 202 is set to be equal to or higher than a breakdown voltage, the internal electric field rises and the multiplication factor becomes extremely high. An image magnification is, for example, 105 to 106 times.

Operating the APD 202 with the doubling rate increased in this manner is referred to as "Geiger mode". In the APD 202 in the Geiger mode, a pair of electrons and holes generated in a PN junction due to the incidence of energy (for example, photons or charged particles) are accelerated by a high electric field. At this time, the electrons are accelerated in a P layer, toward an N layer while increasing motion energy and enter into the N layer with the motion energy sufficiently higher than that of band cap energy of the N layer.

Through the entering, the electrons in the N layer bounce off, and further the bounced electrons generate more electrons in a chain reaction. This is a principle of a multiplication effect.

When a predetermined unit of energy (for example, one photon (charged particle) or charged particle) enters the APD 202 in the Geiger mode, since a great large pulse signal is generated by the above-described multiplication effect, the photons can be counted. Since the light is a collection of the photons, the photons are discrete with weak light.

However, even if the light is weak, the APD 202 can measure the light with high sensitivity by the above-described multiplication effect.

The APD 202 outputs a current having a magnitude corresponding to the number of photons and charged particles detected per hour as a pulse signal. Accordingly, the imaging device 9 in which the APDAs 201 are arranged on the array can detect weak light with higher sensitivity than the case of configuring the imaging device 9 with the PD array. The APD 202 is also prepared with an avalanche mode for outputting a pulse signal having (linear) intensity proportional to the amount of incident light. In the present embodiment, the Geiger mode is used exclusively.

The APDA 201 is a kind of device also called a silicon photomultiplier (Si-PM), and is an assembly of the APDs 202 in the Geiger mode operating individually. When detecting the energy as described above, each APD 202 configuring the pixel of the APDA 201 outputs a pulse signal having an extremely large intensity. In addition, the APDA 201 in the present embodiment outputs a sum of the pulse signals of all the pixels from the output line 203. Therefore, the APDA 201 can detect the weak energy (for example, light or electron) with good sensitivity.

In the APDA 201 of the present embodiment, the driving control lines 204 and 205 of the APD 202 are formed in a matrix form of m columns×n rows so that only a part of the APD 202 can operate in the Geiger mode. The driving control lines 204 and 205 are connected to the APD 202 at an intersection position, and control the operation on a pixel unit. The driving control line 204 for the column and the driving control line 205 for the row are respectively connected to a driving circuit (not illustrated), and similarly to one or a plurality of driving control lines 204 actively controlled by the drive pulses, can apply a reverse voltage only to one or a plurality of APDs 202 positioned at the intersections of one or a plurality of driving control lines 205 which are actively controlled by the driving pulse to operate only one or the plurality of APDs 202 in the Geiger mode. Also in this case, the sum of the pulse signals from the APD 202 operating in the Geiger mode is output from the output line 203.

Since the APDA 201 of the present embodiment can set any number of APDs 202 in the Geiger mode, if only one APD 202 is operated in the Geiger mode, only the output of one APD 202 can be taken out from the output line 203. In the case of the present embodiment, only the APD 202 at any pixel position where the electrons (transmitted electrons) transmitted through the sample 101 are converged is operated in the Geiger mode, and the other APDs 202 become in a dormant state. For example, in accordance with a change in the entering position of transmitted electrons on the imaging surface due to movement of the irradiation position of the electron beam 3 on the sample 101, the pixel position operating in the Geiger mode and the pixel position to be controlled to the dormant state are changed. By reconfiguring (matrixing) the signal output from the imaging device 9, a STEM image can be obtained.

In a case where the pulse signal is not read from the APD 202 for a long period of time, there is a risk of erroneous detection due to thermal noise. Therefore, the APD 202 is periodically reset by the driving control lines 204 and 205. The reset is executed during the period when the APD 202 is in the dormant state. The reset can be performed on all pixels or any pixel by selection of the control line, the time is equal to the reading time of one pixel and also contributes to shortening the time of the entire imaging sequence.

(1-3) Generating Operation of STEM Image

The generating operation of a STEM image in the present embodiment will be described with reference to FIG. 3. This generating operation is controlled by the computer 16 (the control device 17 and the image processing control device 18). When the generation of the STEM image is started, scanning of the electron beam 3 outputted from the electron gun 2 is also started (step S301). In the case of the present embodiment, the light (energy) generated by the scanning of the electron beam 3 sequentially enters from the pixel of the left end to the pixel of the right end of the first row of the APDA 201 illustrated in FIG. 2, and similarly, the light enters from the pixel of the left end to the pixel of the right end of second row, . . . , from the pixel of the left end to the pixel of the right end of n-th row.

The computer 16 controls all the pixels to be in an active state at this timing (step S302). That is, all the pixels are reset. However, this reset operation may be executed simultaneously with the scanning of the electron beam 3 or immediately before the start of scanning. Next, the computer 16 applies the reverse voltage only to the pixel (1, 1), and operates only the pixel in the Geiger mode (step S303). That is, other m*n−1 pixels are in the dormant state. In this case, the pulse signal corresponding to the light incident on the pixel (1, 1) is output from the output line 203.

Next, the computer 16 determines whether the pulse signal corresponding to the last pixel (that is, the pixel (m, n)) is output from the output line 203 (step S304). While a negative result is obtained, the computer 16 proceeds to step S305. In step S305, the computer 16 moves the irradiation position of the electron beam 3 and applies the reverse voltage only to the pixel next to the same row to obtain the pulse signal. When the pixel, to which the reverse voltage is applied, is the last column (that is, the m-th column), the computer 16 changes an application destination of the reverse voltage to a head pixel of the next row. The computer 16 sequentially executes the above operation for all the pixels.

When a positive result is obtained in step S304, the computer 16 proceeds to step S306 and generates a first image (image 1) given by m columns×n rows. Next, the computer 16 determines whether S images are acquired (step S307). While a negative result is obtained, the computer 16 returns to step S302 and repeats the above-described series of operations. By repeating this loop processing S times, S images (images 1 to S) are acquired. If the negative result is obtained in step S307, the computer 16 adds the pulse signals of the same pixel position of the S images (step S308). The computer 16 displays the generated image on a screen of the monitor 19 as an added image (step S309). The added image is stored in a storage area (for example, a memory, a hard disk device, or the like) (not illustrated) in the computer 16.

(1-4) Reacquisition of Attention Region Using STEM Image

A reacquisition operation of an attention region using the STEM image will be described with reference to FIG. 4. FIG. 4A is a STEM image 401 of magnification M1 obtained in the procedure of FIG. 3. While confirming the STEM image 401 on the screen of the monitor 19, an operator specifies a partial region (indicated by a broken line in the drawing) to be reacquired. At this time, the operator also specifies the magnification to be used at the time of reacquisition. The magnification here is defined as M2 (>M1). When receiving these specifications through an user interface, the computer 16 controls the electron gun control device 10 so as to scan only the corresponding region portion with the electron beam, and also controls the objective lens control device 13, magnifying lens control device 14, and the like such that the specified magnification can be obtained. In addition, the computer 16 controls the imaging device 9 and the image processing control device 18 so as to apply the reverse voltage only to the APD 202 corresponding to the specified range.

As described above, the driving control lines 204 and 205 are formed in a matrix form of m columns×n rows in the APDA 201 configuring the imaging device 9. Therefore, the computer 16 drives and controls only the driving control lines 204 and 205 corresponding to the specified range. The content of the control operation executed by the computer 16 is the same as the processing operation illustrated in FIG. 3, except for the pixel range in steps S303 to S305. As a result, as illustrated in FIG. 4B, an enlarged STEM image 402 of magnification M2 is acquired. Since the enlarged STEM image 402 can be acquired by driving only a part of the pixels of the APDA 201, if resolutions (SN ratio) of the STEM image 401 and the enlarged STEM image 402 are the same (if the loop number is the same), the imaging time until the enlarged STEM image 402 is output is shorter than that of the STEM image 401.

In addition, if the imaging time of the enlarged STEM image 402 and the imaging time of the STEM image 401 are the same, it is possible to increase the number of overlapping times (it is possible to increase the number of loops). Therefore, it is possible to further improve the resolution (SN ratio) of the enlarged STEM image 402. Incidentally, in a case where a so-called camera (CCD sensor or CMOS sensor) is used for the imaging device 9, since it is required to read out all the pixels configuring one image even if the required image is a partial image, the resolution (SN ratio) and the imaging time have a conflicting relationship, and it is impossible to realize shortening of the imaging time and improvement of the SN ratio as in the present embodiment.

(1-5) Effect of Examples

As described above, by using the scanning transmission electron microscope 100 in the present examples, the responsiveness can be improved as compared with the prior art. In addition, even in a case where only a part of the acquired STEM image 401 is desired to be imaged with different imaging conditions (for example, different magnifications), by driving only the APD 202 corresponding to the range specified on the screen of the monitor 19, it is possible to obtain the enlarged STEM image 402 in a short time or with a higher SN ratio.

(2) Example 2

In Example 1, a method of resetting the thermal noise of all the pixels in advance as the generating operation of the STEM image is described. However, other methods will be described here. Except for the generating method of the STEM image, it is the same as Example 1.

FIG. 5 illustrates the generating operation of the STEM image in the present example. The generating operation is also executed through control of the computer 16 (the control device 17 and the image processing control device 18). When the generation of the STEM image is started, scanning of the electron beam 3 outputted from the electron gun 2 is also started (step S501). In a case of the present example, the computer 16 resets the pixel (1, 1) and causes thermal noise to be discharged (step S502). This reset operation may be performed simultaneously with the scanning of the charged particle beam or immediately before the start of scanning.

Next, the computer 16 applies the reverse voltage only to the pixel (1, 1) and resets the pixel (2, 1) on the right side in the drawing (step S503). At this time, only the pixel (1, 1) is operated in the Geiger mode, and the other m*n−1 pixels are in the dormant state. Accordingly, the pulse signal corresponding to the light incident on the pixel (1, 1) is output from the output line 203.

Subsequently, the computer 16 determines whether the pulse signal corresponding to the last pixel (that is, the pixel (m, n)) is output from the output line 203 (step S504). While the negative result is obtained, the computer 16 proceeds to step S505. In step S505, the computer 16 moves the position of the charged particle beam and applies the reverse voltage only to the pixel (for example, pixel (2, 1)) adjacent to the right of the same row to obtain the pulse signal. In addition, in parallel with the application of the reverse voltage, the right adjacent pixel (for example, pixel (3, 1)) is further reset. In a case where the pixel to which the reverse voltage is applied or the pixel to be reset is the last column (that is, the m-th column), the computer 16 changes the position of the pixel to which the reverse voltage is applied or the pixel to be reset to the head pixel of the next row. The computer 16 sequentially executes the above operation for all the pixels.

When a positive result is obtained in step S504, the computer 16 proceeds to step S506 and generates a first image (image 1) given by m columns×n rows. Next, the computer 16 determines whether S images are acquired (step S507). While the negative result is obtained, the computer 16 returns to step S502 and repeats the above-described series of operations. By repeating this loop processing S times, S images are acquired. If the negative result is obtained in step S507, the computer 16 adds the pulse signals of the same pixel position of the S images (step S508). The computer 16 displays the generated image on a screen of the monitor 19 as an added image (step S509). The added image is stored in a storage area (for example, a memory, a hard disk device, or the like) (not illustrated) in the computer 16.

If using this method, since each pixel can be reset immediately before operating in the Geiger mode, it is possible to align a state where the influence of thermal noise to the state with the least influence on any pixel on the APDA 201.

(3) Example 3

Here, another generating operation of the STEM image will be described. Except for the generating method of the STEM image, it is the same as Example 1.

FIG. 6 illustrates the generating operation of the STEM image in the present example. The generating operation is also executed through control of the computer 16. First, when the generation of the STEM image is started, scanning of the electron beam 3 outputted from the electron gun 2 is also started (step S601). In the case of this embodiment, the computer 16 resets all the pixels positioned in the first row, that is, m pixels in total from (1, 1) to (m, 1) and causes thermal noise to be discharged (step S602). This reset operation may be performed simultaneously with the scanning of the electron beam 3 or immediately before the start of scanning.

Next, the computer 16 applies the reverse voltage only to the pixel (1, 1) (step S603). At this time, only the pixel (1, 1) is operated in the Geiger mode, and the other m*n−1 pixels are in the dormant state. Accordingly, the pulse signal corresponding to the light incident on the pixel (1, 1) is output from the output line 203.

Subsequently, the computer 16 determines whether the pulse signal corresponding to the last pixel (that is, the pixel (m, n)) is output from the output line 203 (step S604). While the negative result is obtained, the computer 16 proceeds to step S605. In step S605, the computer 16 moves the position of the electron beam 3 and applies the reverse voltage only to the pixel (for example, pixel (2, 1)) adjacent to the right of the same row to obtain the pulse signal. In a case where the pixel to which the reverse voltage is applied is the last column (that is, the m-th column), the computer 16 resets all the pixels in the next row by using the period during which the scanning position of the electron beam 3 moves from the last column to the head column. After this reset, the reverse voltage is sequentially applied from the head pixel of the next row. The computer 16 sequentially executes the above operation for all the pixels.

When a positive result is obtained in step S604, the computer 16 proceeds to step S606 and generates a first image (image 1) given by m columns×n rows. Next, the computer 16 determines whether S images are acquired (step S607). While a negative result is obtained, the computer 16 returns to step S602 and repeats the above-described series of operations. By repeating this loop processing S times, S images are acquired. If the negative result is obtained in step S607, the computer 16 adds the pulse signals of the same pixel position of the S images (step S608). The computer 16 displays the generated image on a screen of the monitor 19 as an added image (step S609). The added image is stored in a storage area (for example, a memory, a hard disk device, or the like) (not illustrated) in the computer 16.

In this method, it is possible to reset a pixel group immediately before operating in the Geiger mode by using the scanning line interleave period (period during which the irradiation position of the charged particle beam moves from the last column of the row to the head column of the next row). In this manner, it is also possible to reduce the difference in the influence of the thermal noise among the pixels configuring the APDA 201. In addition, the processing frequency for the reset operation can be reduced. In the present example, resetting is performed on a row unit. However, in a case where the scanning direction of the electron beam 3 is in the column direction, resetting may be performed on a column unit.

(4) Example 4

In the above-described examples, the case where only one pixel (only one APD 202) is operated in the Geiger mode is described. However, the APDA 201 can simultaneously operate the APD 202 at one or a plurality of pixel positions in the Geiger mode. Therefore, in the present embodiment, a method of specifying a plurality of pixels as one reading range will be described.

FIG. 7 is a diagram for illustrating a method of using a pixel range of 3 columns×2 rows as a reading unit. Here, it is assumed that the range of light (energy) incident from the sample 101 is also moved in the same manner. For example, when the range of the readout pixel is represented by the pixel coordinates of the upper left corner, it moves to pixel (1, 1), pixel (4, 1), pixel (7, 1) .... From the output line 203, the added value of the pulse signals for these six pixels is outputted. By adopting such a reading method, it is possible to realize the imaging with high speed. The range of the readout pixels can be freely determined. For example, as illustrated in FIG. 8, it is also possible to specify read pixels in column units (n pixel units).

In the above description, it is described that the movement in the range of the readout pixel and the movement in the range of light (energy) generated from the sample 101 cooperate. However, the range in which the light (energy) generated from the sample 101 is entered may be the entire range of the APDA 201 or a wider range than the readout range. In addition, as described above, the readout range may be fixed only to a part of the APDA 201, instead of moving the entire range. That is, the range of the readout pixel may be limited only to the region where the STEM image is required. According to this method, it is possible to realize the imaging with high speed.

In addition, in the above-described examples, a case where only one output line 203 is provided to the APDA 201 is described. However, as illustrated in FIG. 9, a plurality of output lines 203 may be provided in the APDA 201. For example, the number of output lines 203 may be m same as the number of columns, or the number may be equal to the total number of pixels (m×n) theoretically. If a plurality of output lines 203 are provided as described above, readout from the range of readout pixels can be executed in parallel. In the example of FIG. 9, it is possible to read out the output of the corresponding readout pixel range in parallel from the four output lines 203. According to this method, it is possible to realize the imaging with high speed. Naturally, the output line may be a row unit.

(5) Other Examples

The present invention is not limited to the above-described examples and includes various modifications. For example, the above-described examples are described in detail in order to describe the present invention easily, and it is not always necessary to provide all the configurations described. In addition, a part of one example can be replaced by the configuration of other examples. Furthermore, the configuration of another example can be added to the configuration of one example. Furthermore, it is possible to add other configuring elements to each example, delete a part of the configuring elements of each example, or replace configuring elements of each example with other configuring elements.

In addition, in the above-described examples, a case where the invention is applied to a scanning transmission electron microscope is described. However, the invention can also be applied to other charged particle beam apparatuses (for example, a transmission electron microscope (TEM), and a scanning electron microscope (SEM)).

The above-described configurations, functions, processing units, processing means and the like, a part or the entire of them, may be implemented by an integrated circuit or other types of hardware, for example. In addition, each of the above-described configurations, functions, and the like may be realized by interpreting and executing a program that realizes the respective functions by the processor (that is, by software). Information on programs, tables, and files to implement these functions may be stored in a recording device such as a memory, a hard disk, or a solid state drive (SSD), or a recording medium such as an IC card, an SD card or a DVD. The control lines and information lines illustrated are those considered necessary for the description, and all of the control lines and information lines necessary for the product are not always illustrated. It may be considered that almost all configurations are mutually connected actually.

REFERENCE SIGNS LIST

1: microscope main body
2: electron gun
3: electron beam
4: irradiation lens
5: scanning coil
6: objective lens
7: sample stage
8: magnifying lens system
9: imaging device
10: electron gun control device
11: irradiation lens control device
12: scanning coil control device
13: objective lens control device
14: magnifying lens control device
15: sample stage control device
16: computer
17: control device
18: image processing control device
19: monitor
100: scanning transmission electron microscope
101: sample
201: avalanche photodiode array
202: avalanche photodiode
203: output line
204: driving control line
205: driving control line
401: STEM image
402: partial STEM image

The invention claimed is:

1. A charged particle beam apparatus comprising:
   an irradiation system that supplies a converged charged particle beam to a sample and scans the sample with the charged particle beam;
   an imaging optical system that images the energy generated in the sample;
   a detection system that detects an image formed by the imaging optical system with an avalanche photodiode array; and
   a control unit that changes a pixel to be operated in a Geiger mode among pixels configuring the avalanche photodiode array according to movement of an irradiation range of the energy.

2. The charged particle beam apparatus according to claim 1,
   wherein the avalanche photodiode array includes a plurality of the pixels arranged in the matrix, and
   wherein the apparatus further comprises a plurality of control lines formed in a matrix and selectively operates predetermined pixels among the plurality of pixels in the Geiger mode.

3. The charged particle beam apparatus according to claim 2,
   wherein the energy is a transmitted electron.

4. The charged particle beam apparatus according to claim 3, further comprising:
   a processing unit that adds the detected image.

5. The charged particle beam apparatus according to claim 4, wherein the control unit causes the pixel to be subjected to a reset operation before operating in the Geiger mode.

6. The charged particle beam apparatus according to claim 4, wherein the control unit causes the pixel to be subjected to the reset operation in a unit of a row or a column before operating in the Geiger mode.

7. The charged particle beam apparatus according to claim 1, wherein the energy is a transmitted electron.

8. The charged particle beam apparatus according to claim 1, further comprising:
a processing unit that adds the detected image.

9. The charged particle beam apparatus according to claim 1, wherein the control unit causes the pixel to be subjected to a reset operation before operating in the Geiger mode.

10. The charged particle beam apparatus according to claim 1, wherein the avalanche photodiode array includes a plurality of the pixels arranged in a matrix, and wherein the control unit causes the pixel to be subjected to a reset operation in a unit of a row or a column before operating in the Geiger mode.

* * * * *